(12) United States Patent
Thompson et al.

(10) Patent No.: US 10,869,401 B1
(45) Date of Patent: Dec. 15, 2020

(54) WIRELESS BOLLARD

(71) Applicants: Jackson Thompson, State College, PA (US); Eric Schleyer, State College, PA (US); Scott Thompson, State College, PA (US)

(72) Inventors: Jackson Thompson, State College, PA (US); Eric Schleyer, State College, PA (US); Scott Thompson, State College, PA (US)

(73) Assignee: Oberon, Inc, State College, PA (US)

( * ) Notice: Subject to any disclaimer, the term of this patent is extended or adjusted under 35 U.S.C. 154(b) by 258 days.

(21) Appl. No.: 16/006,916

(22) Filed: Jun. 13, 2018

Related U.S. Application Data (60) Provisional application No. 62/520,030, filed on Jun. 15, 2017.

(51) Int. Cl.
| | | |
|---|---|---|
| *H05K 5/02* | (2006.01) | |
| *H05K 5/03* | (2006.01) | |
| *H05K 5/00* | (2006.01) | |
| *H04W 88/08* | (2009.01) | |

(52) U.S. Cl.
CPC ......... *H05K 5/0234* (2013.01); *H05K 5/0008* (2013.01); *H05K 5/0213* (2013.01); *H05K 5/0247* (2013.01); *H05K 5/03* (2013.01); *H04W 88/08* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 2,808,135 | A | * | 10/1957 | Moran | E04H 12/08 138/157 |
| 2,916,539 | A | * | 12/1959 | Hamilton | H02G 15/076 174/38 |
| 2,916,591 | A | * | 12/1959 | Benn | H02B 1/50 200/293 |
| 3,055,970 | A | * | 9/1962 | Handley | C23F 13/04 174/37 |
| 3,153,116 | A | * | 10/1964 | Phillips | H01H 85/205 174/38 |
| 3,257,496 | A | * | 6/1966 | Hamilton | F21V 23/00 174/38 |
| 3,309,456 | A | * | 3/1967 | Connell | H02G 7/205 174/38 |
| 3,373,276 | A | * | 3/1968 | Klein | H02B 1/50 174/45 R |
| 3,435,124 | A | * | 3/1969 | Channell | H02G 15/076 174/38 |

(Continued)

*Primary Examiner* — Binh B Tran
*Assistant Examiner* — Krystal Robinson
(74) *Attorney, Agent, or Firm* — John J. Elnitski, Jr.

(57) ABSTRACT

A wireless bollard that is adapted to house electrical and electronic devices and includes an anchor base, equipment stand and an exterior shell. The anchor base is adapted to be attached to a ground level surface. The equipment stand is mounted within the wireless bollard, where the equipment stand is adapted to receive and support at least one device. The exterior shell fits over the equipment stand and is adapted to protect the device and allow transmission of wireless signals, where the exterior shell is mounted to the anchor base and has a shape that is taller than is wide.

9 Claims, 9 Drawing Sheets

(56) References Cited

U.S. PATENT DOCUMENTS

| | | | | |
|---|---|---|---|---|
| 3,652,779 A | * | 3/1972 | Grinols | H01R 4/64 174/38 |
| 3,691,288 A | * | 9/1972 | Sturdivan | H02B 1/50 174/38 |
| 3,714,369 A | * | 1/1973 | Bunten | H02B 1/50 174/38 |
| 3,769,460 A | * | 10/1973 | Charles | H01R 4/64 439/100 |
| 3,812,279 A | * | 5/1974 | Voegeli | H02G 3/14 174/38 |
| 3,928,712 A | * | 12/1975 | Sears | H02G 15/06 174/38 |
| 4,015,397 A | * | 4/1977 | Flachbarth | H02G 3/0493 52/713 |
| 4,097,683 A | * | 6/1978 | Summers | G02B 6/4451 174/38 |
| 4,284,300 A | * | 8/1981 | Campbell | F16B 41/005 292/251 |
| 4,365,108 A | * | 12/1982 | Bright | H05K 5/03 174/37 |
| 4,382,155 A | * | 5/1983 | Borin | H02G 9/00 174/38 |
| 4,415,217 A | * | 11/1983 | Clabburn | H01R 31/02 439/488 |
| 4,519,657 A | * | 5/1985 | Jensen | H02B 1/50 174/38 |
| 4,626,616 A | * | 12/1986 | Masters | H02G 9/00 109/52 |
| 4,631,353 A | * | 12/1986 | Marks | H02G 9/10 174/16.1 |
| 4,751,610 A | * | 6/1988 | Nickola | H02B 1/50 174/38 |
| 4,873,600 A | * | 10/1989 | Vogele | H02B 1/50 361/823 |
| 4,887,187 A | * | 12/1989 | Nickola | H02B 1/50 361/664 |
| 4,892,978 A | * | 1/1990 | Axworthy | H02G 9/10 174/38 |
| 5,184,279 A | * | 2/1993 | Horn | H02B 1/50 174/38 |
| 5,196,988 A | * | 3/1993 | Horn | H02B 1/50 174/38 |
| 5,210,374 A | * | 5/1993 | Channell | G02B 6/4444 174/38 |
| D354,739 S | * | 1/1995 | Durham | D13/184 |
| 5,384,427 A | * | 1/1995 | Volk | H02B 1/28 174/37 |
| 5,400,212 A | * | 3/1995 | Hanson | H02B 1/03 174/38 |
| 5,401,902 A | * | 3/1995 | Middlebrook | G02B 6/4451 174/37 |
| D367,464 S | * | 2/1996 | Jones | D13/139.5 |
| 5,611,616 A | * | 3/1997 | Chandler | H02B 1/50 116/202 |
| 5,734,776 A | * | 3/1998 | Puetz | G02B 6/4442 385/134 |
| 5,860,715 A | * | 1/1999 | Lohde | A47B 45/00 174/50 |
| D434,001 S | * | 11/2000 | Sayger | D13/139.5 |
| 6,501,015 B2 | * | 12/2002 | Maloney | H02G 3/0493 174/17 VA |
| 6,586,671 B1 | * | 7/2003 | Kelley | H02G 9/10 174/38 |
| 6,877,886 B2 | * | 4/2005 | Schuster | F21V 21/116 174/38 |
| 6,975,505 B2 | * | 12/2005 | Wise | H02B 1/52 361/664 |
| 7,045,710 B1 | * | 5/2006 | Allen | G02B 6/4442 174/38 |
| 7,351,909 B1 | * | 4/2008 | Harwood | H02G 3/0493 174/37 |
| 7,357,009 B2 | * | 4/2008 | Maloney | E05B 17/002 174/135 |
| 7,361,832 B2 | * | 4/2008 | Dively | H02G 3/0493 174/37 |
| 7,700,874 B2 | * | 4/2010 | Maloney | H02B 1/50 174/38 |
| 7,807,924 B2 | * | 10/2010 | Wurzer | H02G 3/0493 174/59 |
| 8,089,747 B2 | * | 1/2012 | Storck | H02G 3/0493 361/641 |
| 9,382,722 B2 | * | 7/2016 | Banyi | E04H 12/2292 |
| 9,768,592 B2 | * | 9/2017 | Unger | H02B 1/28 |
| 9,991,689 B2 | * | 6/2018 | Drueke | H02G 3/081 |
| 10,053,861 B2 | * | 8/2018 | Lavery | E04F 10/08 |
| 10,158,221 B2 | * | 12/2018 | Seff | G08B 5/36 |
| 2001/0018978 A1 | * | 9/2001 | Gordin | E04H 12/2253 174/2 |
| 2002/0096346 A1 | * | 7/2002 | Maloney | H02G 3/0493 174/50 |
| 2005/0285011 A1 | * | 12/2005 | Harwood | E04H 12/2261 248/519 |
| 2006/0254794 A1 | * | 11/2006 | Burke | H02G 3/185 174/38 |
| 2007/0182567 A1 | * | 8/2007 | Stewart | A63B 71/0686 340/572.8 |
| 2008/0253061 A1 | * | 10/2008 | Seff | H02B 1/50 361/622 |
| 2008/0253062 A1 | * | 10/2008 | Seff | H02B 1/50 361/622 |
| 2009/0057119 A1 | * | 3/2009 | Burkett | H01R 13/5202 200/332.1 |
| 2010/0051310 A1 | * | 3/2010 | Wurzer | H02G 3/0493 174/59 |
| 2010/0052549 A1 | * | 3/2010 | Hudson | E01F 9/617 315/156 |
| 2012/0256810 A1 | * | 10/2012 | Caldwell | H01Q 1/1242 343/890 |
| 2012/0307069 A1 | * | 12/2012 | Pierce | H04N 5/247 348/159 |

* cited by examiner

WIRELESS BOLLARD

This application claims the benefit of and incorporates by reference U.S. Provisional Application No. 62/520,030 filed Jun. 15, 2017.

BACKGROUND

The present invention generally relates enclosure and mounting solutions for wireless networking, Wi-Fi, telemetry, environmental monitoring, and other equipment. More specifically, the present invention relates to an enclosure and apparatus that mounts outdoors, and encloses and protects wireless electronics, antennas, connectors and cables.

Wireless LAN communication has become very popular for computer networking in schools, hospitals, factories, public buildings, and office buildings. Now the wireless LAN is being extended into outdoor environments including parks, greenspaces, courtyards, walkways, streets, gardens pool areas, etc. A main part of a wireless communication system is the wireless node or access point. The access point is the unit which communicates wirelessly with mobile devices carried by users. The access point is generally connected to the main network with a data cable and is powered by an external power supply which is plugged into the access point. Indoors, access points are usually mounted in the ceilings of buildings to improve their wireless coverage and as a way to partially conceal their unappealing appearance and the cables required to interconnect the access point with the network and to power it. Outdoors the access points are mounted on the side of a building on a utility pole or light pole. The access point is an expensive piece of equipment which can be easily stolen from the outside of a building.

Access points and antennas can be a variety of shapes and sizes based on the manufacturer of the access point. The different shapes and sizes present a problem to finding a way to universally secure an access point. It is desirable to have a means to conveniently mount the access point in the outdoors, conceal much of the access points and connected cables, secure the access point, and give it an overall appearance which is acceptable architectural or design wise for the appearance of the venue. In addition to wireless access points, it may be desirable to mount other wireless electronic components, sensors, telemetry, and multi-media gateways outdoors, including wireless access gear for building automation and asset tracking, real time location systems, ultrasonic transducer, distributed antenna system (DAS) antennas and remote access units, wireless monitoring equipment, video cameras, multimedia projectors, air quality sensors, particle counters, differential pressures sensors, and light and sound sensors It is an object of the present invention to provide an apparatus that provides for an aesthetic, conveniently installed secure mounting of wireless devices and sensors in an outdoor environment.

SUMMARY

A wireless bollard that is adapted to house electrical and electronic devices and includes an anchor base, equipment stand and an exterior shell. The anchor base is adapted to be attached to a ground level surface. The equipment stand is mounted within the wireless bollard, where the equipment stand is adapted to receive and support at least one device. The exterior shell fits over the equipment stand and is adapted to protect the device and allow transmission of wireless signals, where the exterior shell is mounted to the anchor base and has a shape that is taller than is wide.

DETAILED DESCRIPTION OF THE INVENTION

The present invention is a wireless bollard. The wireless bollard is an enclosure and mounting solution which is designed to secure and protect devices such as wireless equipment, Wi-Fi, telemetry, multi-media gateways, environmental monitoring, sensing devices, and their associated cables, connectors, power supplies media-converters etc. which may be mounted outside or in public venues. The wireless bollard provides for positioning enclosed electronic devices and antennas for optimum wireless coverage, while protecting the equipment from weather, tampering and abuse. The wireless bollard provides an enclosure with an exterior which is architecturally aesthetic, and also does not affect or impeded the wireless coverage. The wireless bollard provides for fast and easy installation and maintenance of the equipment.

Figure 1:
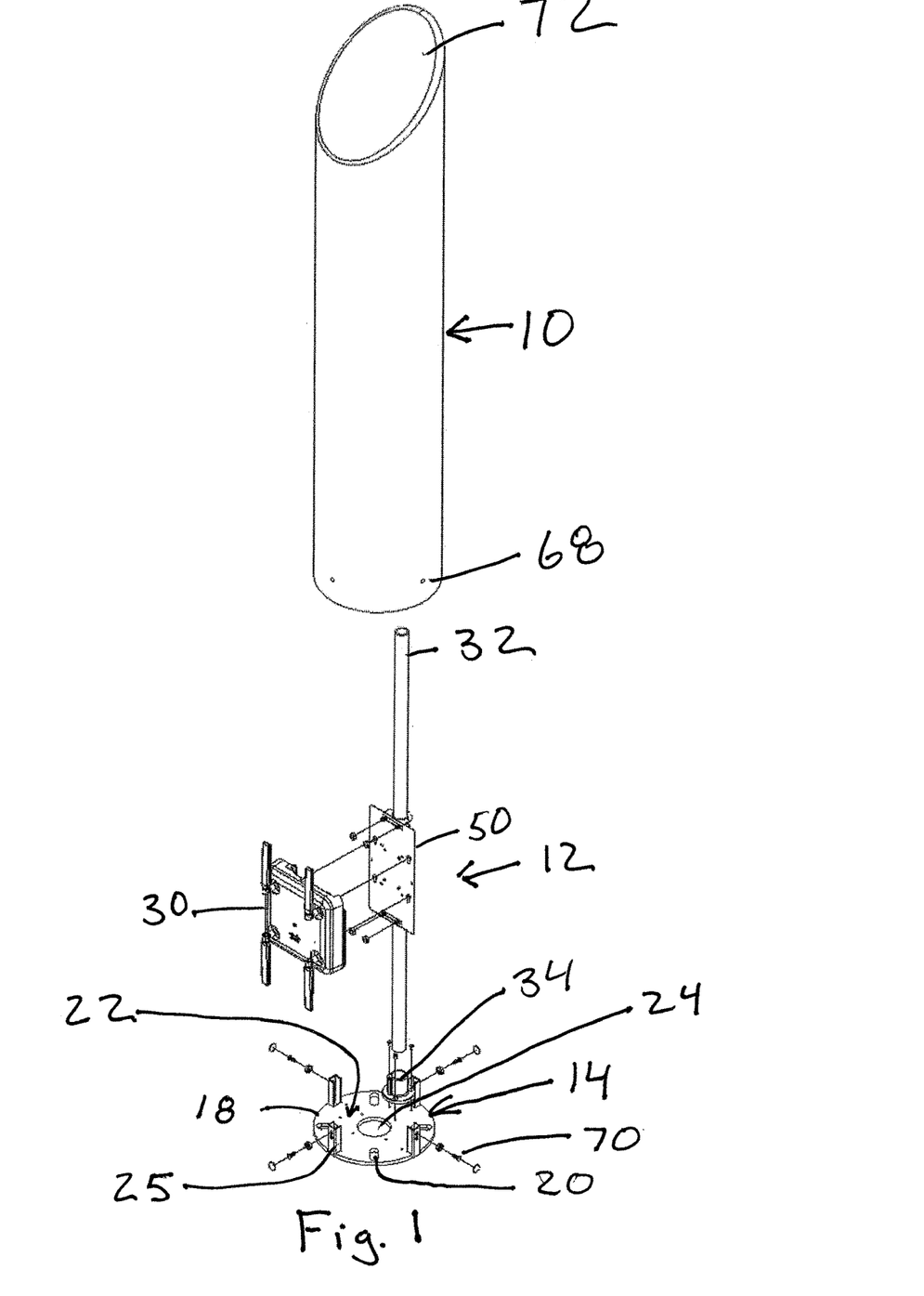
FIG. 1 is a perspective exploded view of a wireless bollard according to the present invention.
Figure 2:
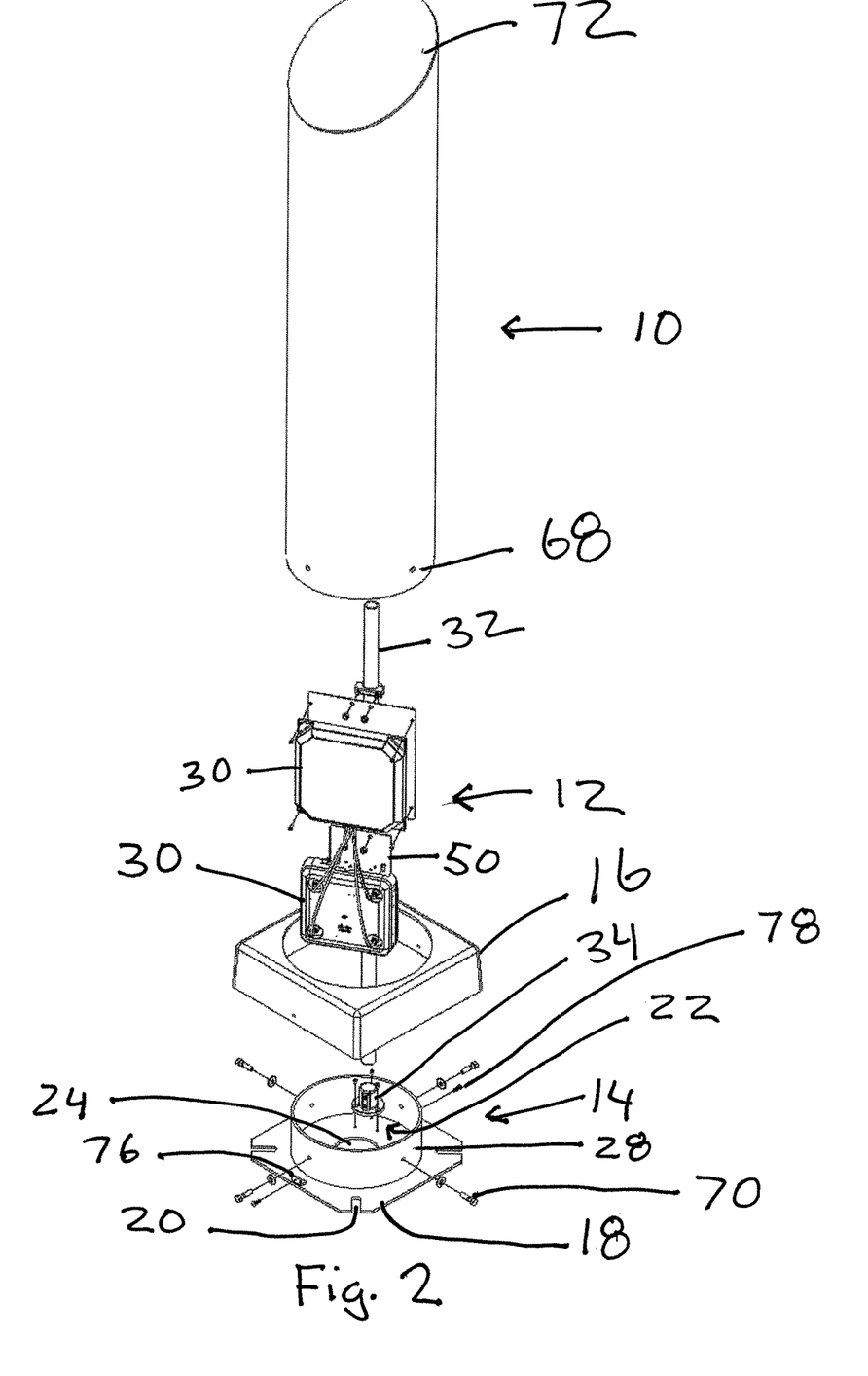
FIG. 2 is a perspective exploded view of a wireless bollard according to the present invention.
Figure 3:
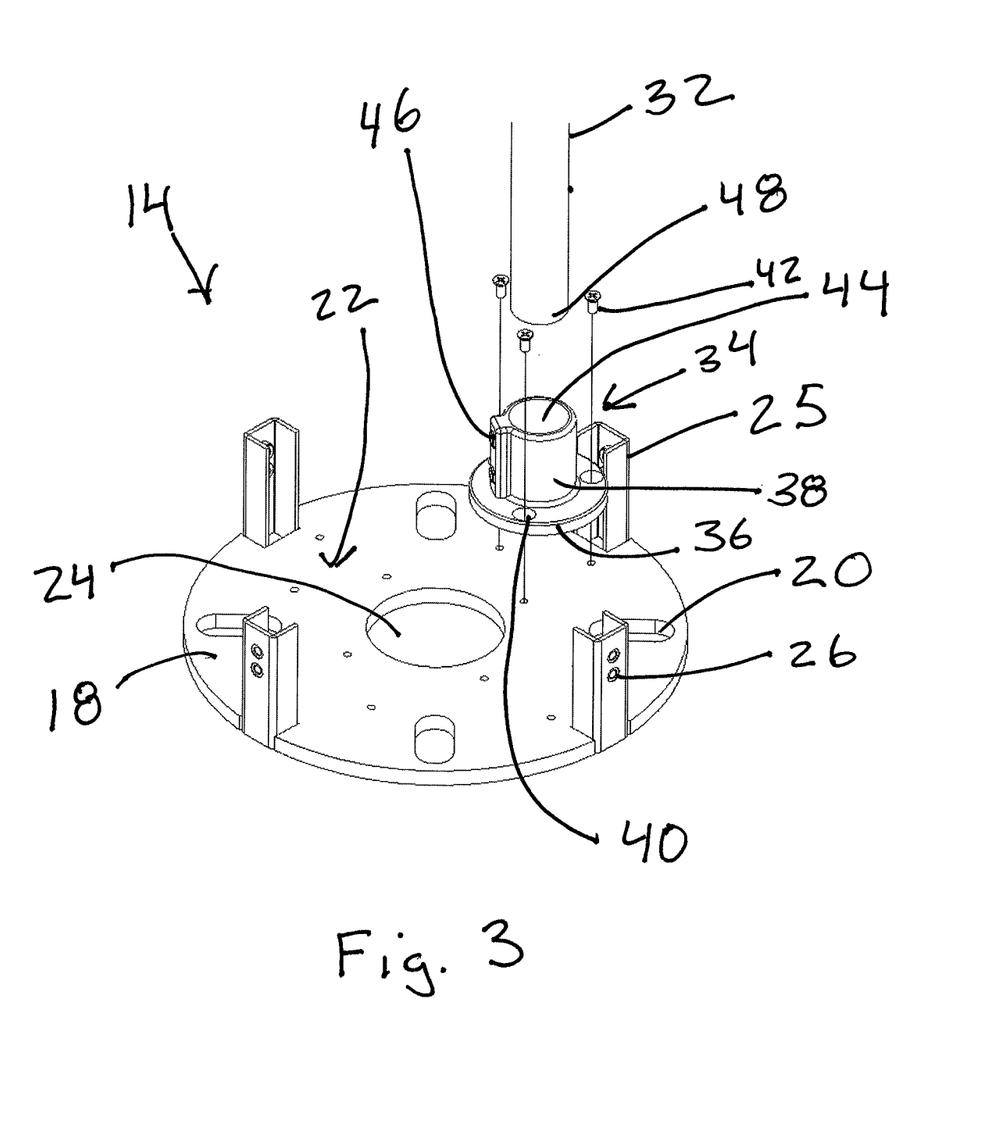
FIG. 3 is a perspective view of an anchor base to the present invention.

The wireless bollard includes an exterior shell 10, equipment stand 12, anchor base 14, and an optional bolt cover 16. FIGS. 1-2 show different embodiments of the wireless bollard. Each embodiment includes the exterior shell 10, equipment stand 12, and anchor base 14. The difference between the embodiments of FIGS. 1-2 is the anchor base 14. The equipment stand 12 and exterior shell 10 are mounted to the anchor bases 14 shown in FIGS. 3-4. The anchor base 14 is a plate 18 that will be typically permanently attached to concrete, asphalt or flooring that is on a ground level surface. Anchors slots 20 as shown in FIGS. 1-4 are used to secure the anchor base 14 to the ground level surface, along with fasteners such as bolts or studs and nuts. The anchor base 14 may also be temporarily fixed to a softer ground level surface such as soil using ground anchors or spikes with the anchor slots. The anchor base 14 includes a plurality of sets of threaded pole base holes 22 to provide different locations to mount the equipment stand 12, so that the equipment stand 12 can be positioned as desired to point the devices in the proper direction. The anchor base 14 includes at least one conduit opening 24 for conduit, cabling and wires to enter the wireless bollard. The anchor base 14 includes shell mounting points for the exterior shell 10. FIGS. 1 and 3 show shell mounting tabs 25 that each has two threaded shell holes 26 to serve as the shell mounting points.

Figure 4:
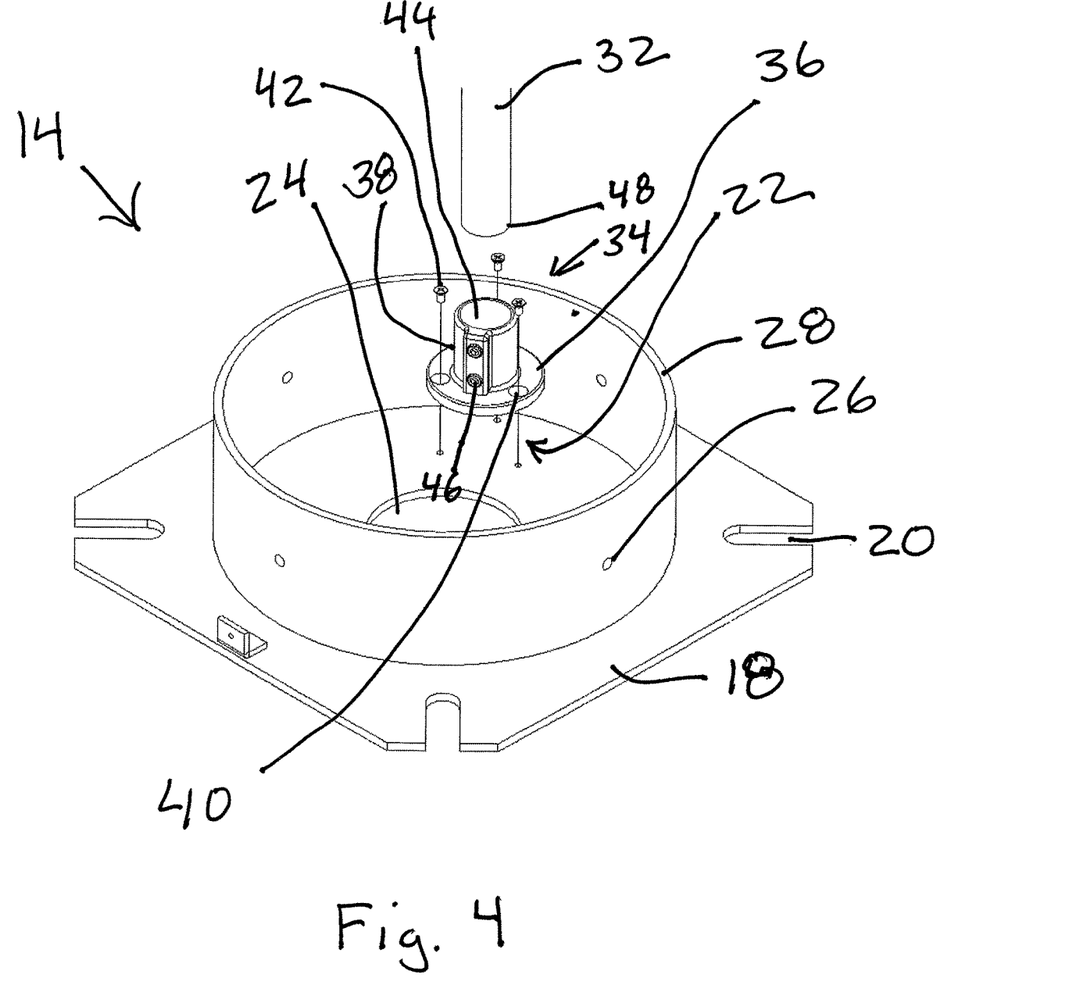
FIG. 4 is a perspective view of an anchor base to the present invention.

FIGS. 2 and 4 show a mounting ring 28 having four threaded shell holes 26 to serve as the shell mounting points.

Figure 5:
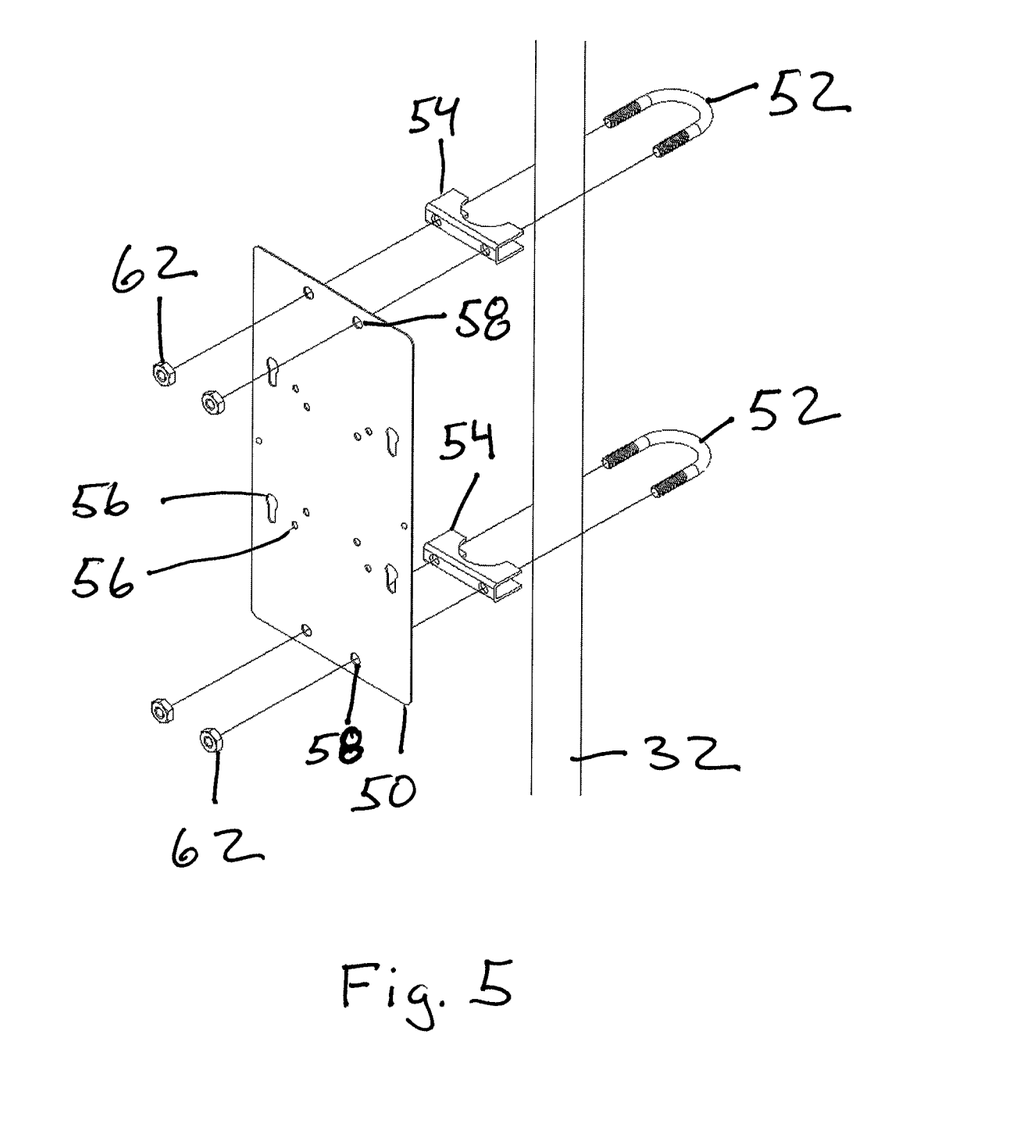
FIG. 5 is an exploded perspective view of an equipment stand according to the present invention.
Figure 6:
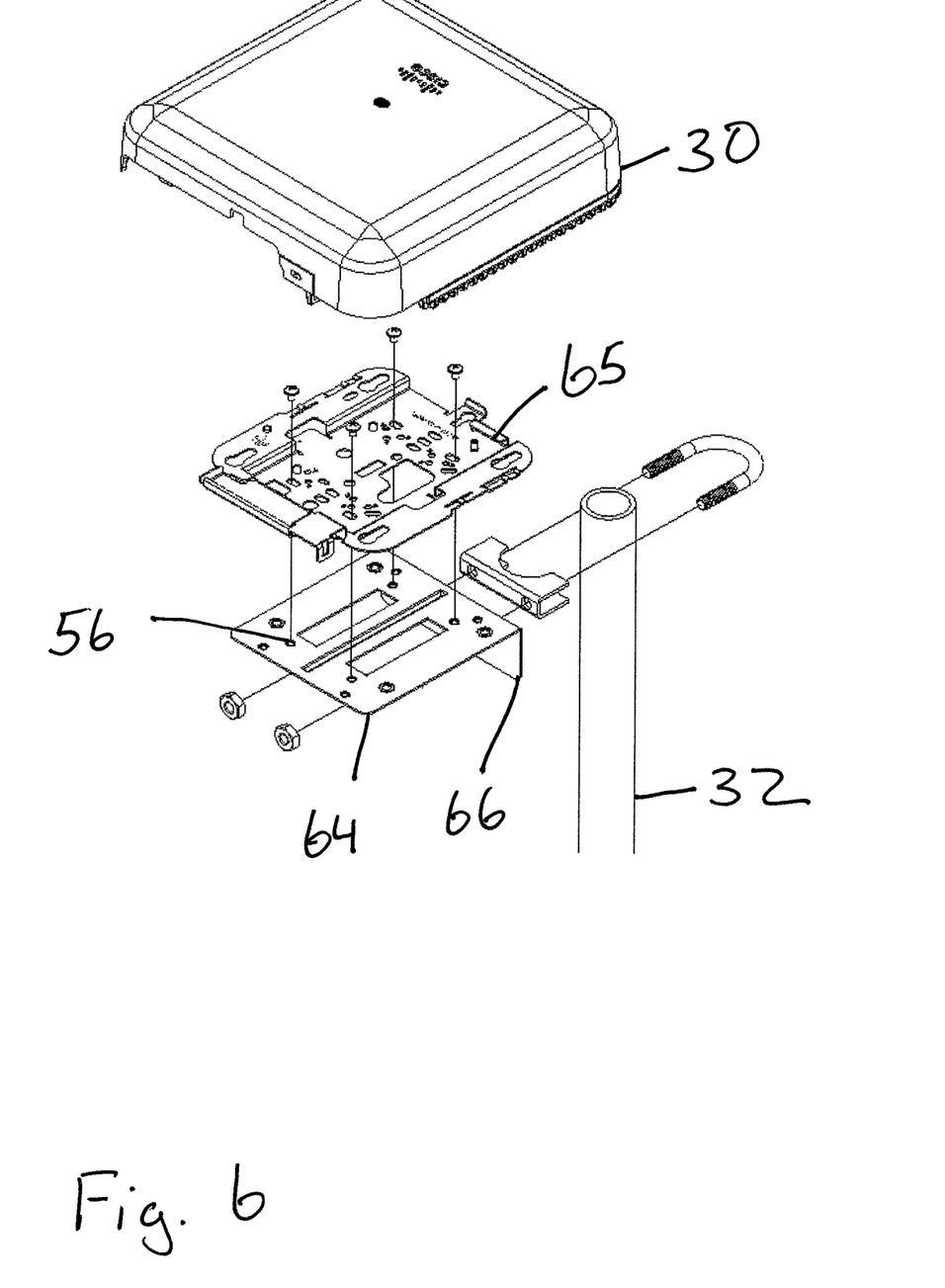
FIG. 6 is an exploded perspective view of an equipment stand according to the present invention.

The equipment stand 12 is an interior structure for mounting and positioning the devices. The equipment stand 12 can accommodate access points with internal antennas, access points with attached dipole antennas, omnidirectional antennas, directional antennas and other equipment. The equipment stand 12 provides an adjustable platform which permits antennas to be positioned and directed for the desired coverage. Devices 30 are mounted on the adjustable equipment stand 12, with the antennas oriented in the desired direction or position. The devices 30 are connected to power and or data cable that come through the anchor base 14. The equipment stand 12 is shown to include a pole 32, pole base 34, and a device mounting assembly. The pole 32 is preferably of a non-metallic material, such as fiberglass. The pole base 34 includes a mounting flange 36 and a pole collar 38 extending up from the mounting flange 36. The mounting flange 36 includes anchor base holes 40 to accept fasteners 42. The pole base 34 mounts to one of the sets of pole base holes 22 of the anchor base 14 by aligning the anchor base holes 40 of the mounting flange 36 with the pole base holes 22 and using the fasteners 42 to secure the pole base 34 to the anchor base 14. The pole collar 38 includes a pole receiving recess 44 and collar set screws 46 that penetrate into the pole receiving recess 44. A bottom end 48 of the pole 32 slides into the pole receiving recess 44 and is secured in place using the collar set screws 46. The device mounting assembly is a pole mount bracket that has components that are used to mount the device 30 or devices 30 to the pole 32. FIGS. 1-2 and 5 show a version of the device mounting assembly that includes a device plate 50 and two pole clamp assemblies. The pole clamp assemblies each include a U bolt 52 and saddle clamp 54. The saddle clamp 54 includes a round side match the shape of the pole 32 and to go around the pole 32. The saddle clamp 54 includes a flat side to provide a mounting surface for the device plate 50. The device plate 50 includes device mount holes 56 and pole mount holes 58. The pole mount holes 58 are positioned to receive the ends of the U bolts 52 so that the device plate 50 rests against the flat side of the saddle clamp 54. Nuts 62 on the U bolts 52 secure the device plate 50 and the U bolts 52 to the pole 32 due to the clamping action of the saddle clamp 54. It may be desirable to mount some access points or antennas in a horizontal orientation, as shown in FIG. 6. FIG. 6 shows a device plate 64 with a mounting flange 66 so the device plate 64 can be mounted ninety degrees to the flat side of the saddle clamp 54 and the pole 32. FIG. 6 also shows a device interface plate 65 which mounts to the device plate 64 using fasteners and the device mount holes 56, where the device 30 mounts to the device interface plate 65. The use of device interface plates allow for the device plates to be universal and the device interface plate to be device specific. The device mounting assembly may articulate to mount access points in a horizontal or different orientation, or on top of the pole 32. There can be more than one device mounting assembly mounted to the pole 32 to allow for multiple devices 30 to be mounted to the pole 32, as shown in FIG. 2. The pole 32 and device mounting assembly allows for the orientation and direction of antennas properly without impeding the wireless signal. Most of the access points and antennas from different vendors are provided with components for outdoor pole mounting. The device 30 can be moved up and down the pole 32 to position access points and antennas where desired. The pole 32 can also be mounted in multiple positions on the anchor base 14, which is based on what set of pole base holes 22 are used. By positioning both the pole 32 and the orientation of the access point or antenna, the wireless designer can provide the coverage desired. Other items may be attached to the equipment stand 12 such as cables, power supplies, power outlets, media converters, switches, etc.

Figure 7:
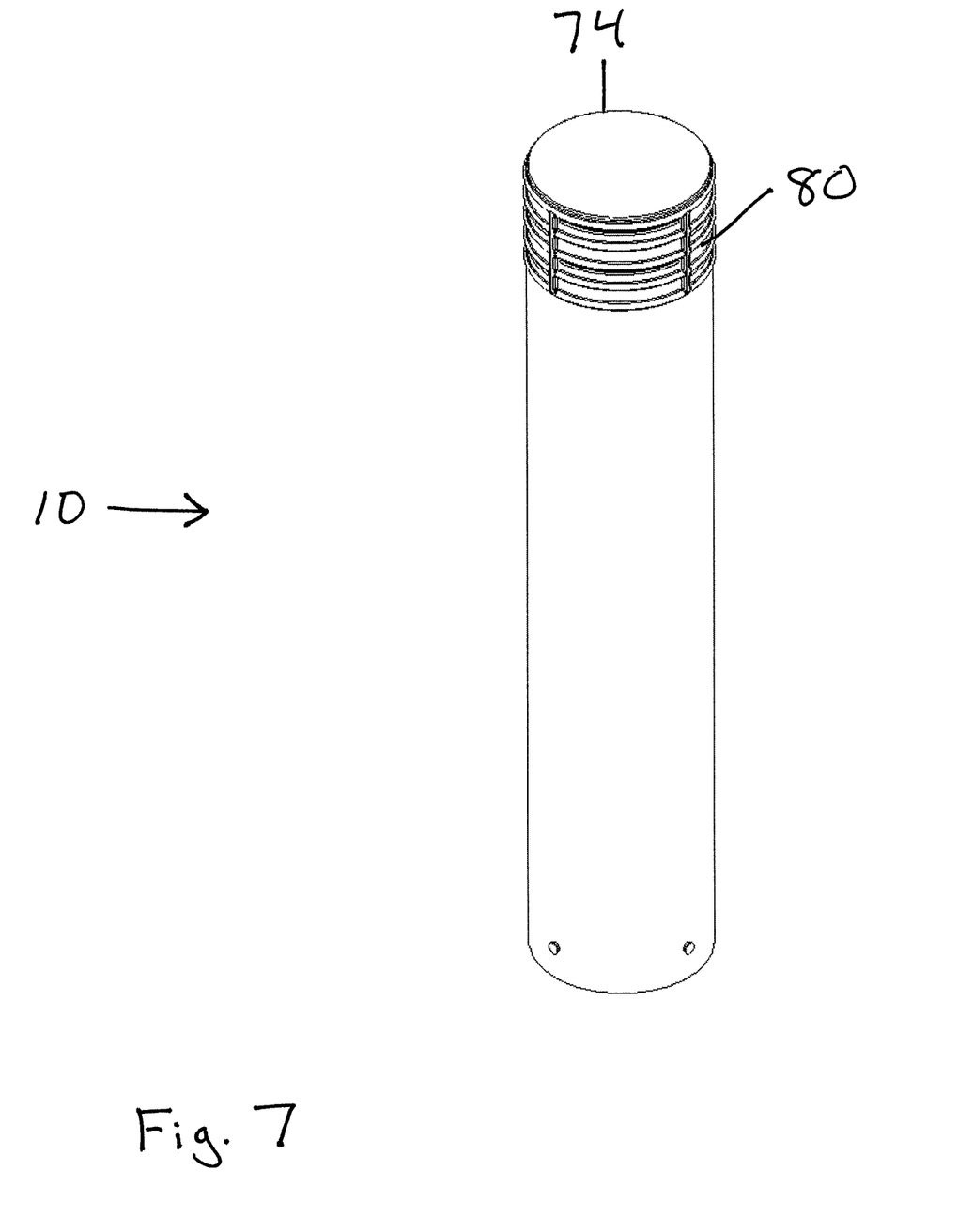
FIG. 7 is a perspective view of an exterior shell according to the present invention.
Figure 8:
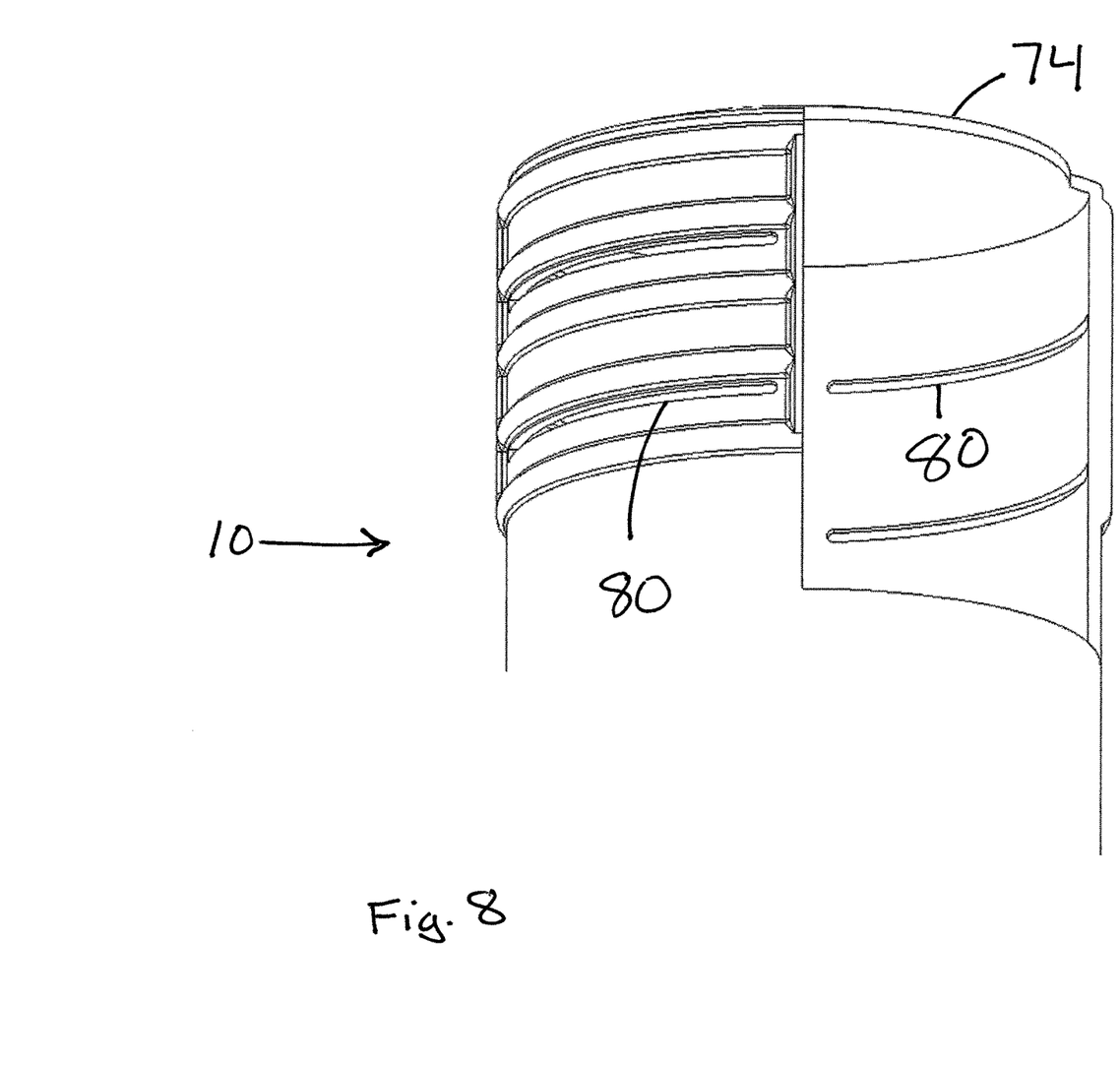
FIG. 8 is a cut-away perspective view of an exterior shell according to the present invention.
Figure 9:
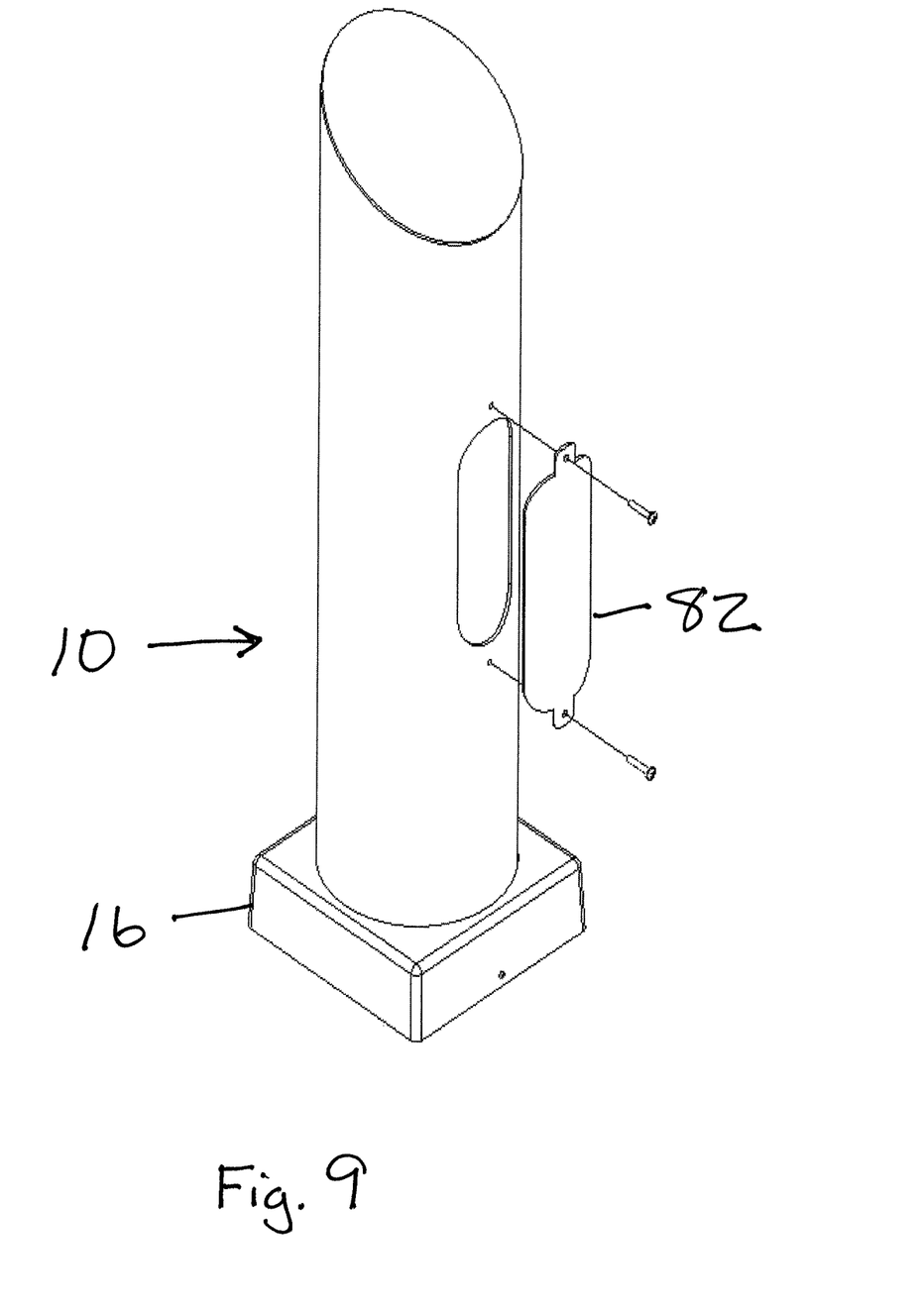
FIG. 9 is an exploded perspective view of an exterior shell according to the present invention.

The exterior shell 10 fits over the equipment stand 12 and device 30 and is fastened to the anchor base 14, as shown in FIGS. 1 and 2. FIG. 1 shows anchor holes 68 near the bottom of the exterior shell 10 that are used to secure the exterior shell 10 to the anchor base 14 using threaded fasteners 70 with the threaded shell holes 26 of mounting tabs 25. FIG. 2 shows anchor holes 68 near the bottom of the exterior shell 10 that are used to secure the exterior shell 10 to the anchor base 14 using threaded fasteners 70 with the threaded shell holes 26 located on the mounting ring 28. The exterior shell 10 is shown as a round cylinder shape that has a height that is taller than its width and is typically referred to as a bollard. The cylinder shape can be other than round, such as square or hexagonal. The exterior shell 10 is of a material which is transparent to wireless signals and protects the electronic equipment within the exterior shell 10 from weather, spraying water, tampering, theft, and vandalism. The exterior shell 10 can be made of lightweight materials or heavy weight materials designed to take abuse during an act of vandalism. It is recommended that the exterior shell 10 be of a non-metallic material in order to have minimal impact on a wireless signal. The exterior shell 10 may be fiberglass or plastic material. Most importantly the exterior shell 10 provides for concealing all of the enclosed components. The exterior shell 10 may have a flat, beveled, domed, or pointed top, where FIGS. 1-2 show a beveled top 72 and FIGS. 7-8 show a domed top 74. FIG. 2 shows the bolt cover 16 that can be slid over the exterior shell 10 attached to cover tabs 76 to conceal the fasteners 70 which attach the exterior shell 10 to the anchor base 14. Screws 78 are shown fastening the bolt cover 16 to the cover tabs 76 of the anchor base 14, where the screws 78 and cover tabs 76 are a bolt cover fastening assembly to attach the bolt cover 16 to the wireless bollard. Non-screw fasteners can also be used to mount the bolt cover 16 to either the anchor base 14 or exterior shell 10. An example of non-screw fasteners are snap tabs and holes to receive the tabs that work together to form the bolt cover fastening assembly. The bolt cover 16 improves appearance and protects the bollard from lawn mowers, weed whackers, etc. FIGS. 7-8 show the exterior shell 10 with air vents 80 near the top of the exterior shell 10. The air vents 80 are slots in the near the top of the exterior shell 10 that allow heat generated by a device to dissipate. The exterior shell 10 may have openings in the exterior for different wired connections. For example, there may be external RJ-45, USB, HDMI, data, RF coaxial, antenna, power or other connectors. FIG. 9 shows an exterior shell 10 with an access panel 82 that can be opened to access the mounted device and wired connections.

While different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

We claim:

1. A wireless bollard adapted to house electrical and electronic devices, comprising:
   an anchor base adapted to be attached to a ground level surface;

an equipment stand mounted within said wireless bollard, said equipment stand adapted to receive and support at least one device;

an exterior shell which fits over said equipment stand adapted to protect the device and allow transmission of wireless signals, said exterior shell mounted to said anchor base, said exterior shell having a shape that is taller than is wide; and wherein said equipment stand includes a pole, pole base to support said pole with said wireless bollard and a device mounting assembly that mounts to said pole.

2. The wireless bollard of claim 1, wherein said pole base includes a mounting flange to mount said pole base to said anchor base and a pole collar extending up from said mounting flange, said pole collar including a pole receiving recess to receive an end of said pole.

3. The wireless bollard of claim 2, wherein said anchor base includes a plurality of sets of pole base holes to provide different locations to mount said equipment stand so that said equipment stand can be positioned as desired to point the devices in a proper direction; and wherein said mounting flange including anchor base holes aligned to match with one of said sets of pole base holes.

4. The wireless bollard of claim 1, wherein said device mounting assembly is a pole mount bracket that has components that are used to mount the device to the pole.

5. The wireless bollard of claim 1, wherein said pole mount bracket includes a device plate adapted to mount a device and two pole clamp assemblies, said pole clamp assemblies each including a U bolt, two nuts and a saddle clamp, said saddle clamp includes a round side to go around said pole and a flat side to provide a mounting surface for said device plate, said device plate includes pole mount holes to receive said U bolts.

6. The wireless bollard of claim 5, wherein said device plate is mounted to said flat side so said device plate is ninety degrees to said length of said pole.

7. A wireless bollard adapted to house electrical and electronic devices, comprising:

an anchor base adapted to be attached to a ground level surface;

an equipment stand mounted within said wireless bollard, said equipment stand adapted to receive and support at least one device;

an exterior shell which fits over said equipment stand adapted to protect the device and allow transmission of wireless signals, said exterior shell mounted to said anchor base, said exterior shell having a shape that is taller than is wide; and a bolt cover to surround said exterior shell near said anchor base.

8. The wireless bollard of claim 7, wherein said equipment stand includes a pole, pole base to support said pole with said wireless bollard and a device mounting assembly that mounts to said pole.

9. A wireless bollard adapted to house electrical and electronic devices, comprising:

an anchor base adapted to be attached to a ground level surface;

an equipment stand mounted within said wireless bollard, said equipment stand adapted to receive and support at least one device;

an exterior shell which fits over said equipment stand adapted to protect the device and allow transmission of wireless signals, said exterior shell mounted to said anchor base, said exterior shell having a shape that is taller than is wide;

wherein said exterior shell has anchor holes, where said anchor base includes threaded mounting points and where said exterior shell is mounted to said anchor base using bolts, said anchor holes and said threaded mounting points; and wherein said equipment stand includes a pole, pole base to support said pole with said wireless bollard and a device mounting assembly that mounts to said pole.

* * * * *